(12) United States Patent
Yoo et al.

(10) Patent No.: US 7,276,140 B2
(45) Date of Patent: Oct. 2, 2007

(54) PLASMA ACCELERATING APPARATUS FOR SEMICONDUCTOR SUBSTRATE PROCESSING AND PLASMA PROCESSING SYSTEM HAVING THE SAME

(75) Inventors: Jin-woo Yoo, Suwon-si (KR); Won-taek Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/435,770

(22) Filed: May 18, 2006

(65) Prior Publication Data

US 2006/0284563 A1 Dec. 21, 2006

(30) Foreign Application Priority Data

Jun. 17, 2005 (KR) ............ 10-2005-0052514

(51) Int. Cl.
C23C 14/00 (2006.01)
C23F 1/02 (2006.01)

(52) U.S. Cl. .............. 204/298.34; 204/298.33; 204/298.31; 156/345.39; 156/345.4; 118/723 VE; 118/723 EB; 315/111.71; 315/111.61

(58) Field of Classification Search ............. 204/298, 204/298.34, 298.33, 298.31; 156/345, 345.39, 156/345.4; 118/723, 723 VE, 723 EB; 315/111, 315/111.71, 111.61
See application file for complete search history.

(56) References Cited

U.S. PATENT DOCUMENTS 5,845,880 A * 12/1998 Petrosov et al. ............ 244/169

5,847,493 A    12/1998 Yashnov et al.
6,824,363 B2   11/2004 Mitrovic et al.
2005/0237000 A1* 10/2005 Zhurin ................ 315/111.81
2007/0013284 A1*  1/2007 Lee ...................... 313/231.31

FOREIGN PATENT DOCUMENTS

| GB | 2397782 B       | 12/2006 |
| IN | 200286          | 4/2006  |
| JP | 2002-151298 A   | 5/2002  |
| KR | 10-2004-0053502 A | 6/2004 |
| KR | 10-2004-0096044 A | 11/2004 |
| WO | WO 03/076790 A1 | 9/2003  |

OTHER PUBLICATIONS

Letter submitted by Gopalakrishnan Srinivasan Third Party dated Feb. 12, 2007. (Citation of Prior Art).

* cited by examiner

*Primary Examiner*—Tuyet Vo
(74) *Attorney, Agent, or Firm*—Sughrue Mion Pllc.

(57) ABSTRACT

A plasma accelerating apparatus and a plasma processing system having the same are provided. The apparatus includes a circular channel comprising an inner wall, an outer wall, and an end wall connected to an end of the inner wall and the outer wall to form an outlet port at the other ends of the inner and outer walls; a gas supply portion to supply a gas to an inside of the channel; and a plasma generating and accelerating portion to supply ionization energy to the gas inside the channel to generate a plasma beam, and to accelerate the generated plasma beam toward the outlet port, wherein one of the inner wall and outer wall of the channel is inclined at an angle so that the other end of the wall is located closer to a center of the plasma accelerating apparatus.

11 Claims, 7 Drawing Sheets

PLASMA ACCELERATING APPARATUS FOR SEMICONDUCTOR SUBSTRATE PROCESSING AND PLASMA PROCESSING SYSTEM HAVING THE SAME

CROSS-REFERENCE TO RELATED APPLICATIONS

This application claims priority from Korean Patent Application No. 10-2005-0052514 filed on Jun. 17, 2005 in the Korean Intellectual Property Office, the entire contents of which is incorporated herein by reference.

BACKGROUND OF THE INVENTION

1. Field of the Invention

The present invention relates to a plasma accelerating apparatus, and more particularly, to a plasma accelerating apparatus and a plasma processing system having the same, which is used for semiconductor substrate processing for etching and removing a thin film from a substrate or depositing the thin film on the substrate.

2. Description of the Related Art

In recent years, with the increased need of high speed microprocessors and high recording density memories, a technique of reducing a thickness of a gate dielectric substance and a lateral size of a logic element has been actively developed so that many elements can be mounted on one semiconductor chip. There is a technique of reducing a gate length of a transistor to less than 35 nm, a thickness of a gate oxide to less than 0.5 nm, and improving a metallization level greater than six as an example of the aforementioned technique.

However, in order to embody such a technique, high performance deposition and/or etching devices capable of increasing a mounting density of a device at the time of a manufacturing process of the semiconductor chip have been required. Among the high performance deposition and/or etching devices, a plasma etcher or a plasma sputtering system using a plasma accelerating apparatus has been widely used.

FIG. 1 is a schematic cut-away perspective view showing a Hall effect plasma accelerating apparatus 10 used for a plasma etcher or a plasma sputtering system as an example of a conventional plasma accelerating apparatus. The Hall effect plasma accelerating apparatus 10 is disclosed in U.S. Pat. No. 5,847,593.

With reference to FIG. 1, the Hall effect plasma accelerating apparatus 10 includes a circular channel 22 having an upper shielded end and a lower open end. (Note that the lower open end faces up in the figure.) An internal circle coil 16 and external circle coils 17, 18, 18', and 19 are coaxially positioned at an inside and an outside of the circle channel 22 in a line. The circle coils 16, 17, 18, 18', and 19 have physically and magnetically isolated polarity to form a magnetic field. A circular anode electrode 24 is connected to a gas supply pipe 25 and ionizes a supplied gas. A cathode electrode 27 is positioned on a magnetic pole of a lower end of a channel 22 and connected to the gas supply line 29, and supplies electrons.

The external circle coils 17, 18, 18', and 19 are divided into an upper coil 17 and lower coils 18, 18' and 19 of separated sections. Encircling an outside of the channel 22 is the upper coil 17 and encircling an opening of the channel 22 are the lower coils 18, 18' and 19. Upper portions of the upper coil 17 and the internal coil 16 are isolated by a dielectric layer 23. A magnetic field of the isolated region is shielded, so that a partially magnetic field intersecting a space portion 20 of the channel 22 is induced at only a region of an opening 22a of the channel 22, but not at an entire portion of the channel 22. A magnetic field formed at positions of the lower coils 18, 18' and 19 partially captures electrons.

Consequently, the Hall effect plasma accelerating apparatus 10 may accelerate only positive ions, and thus cannot accelerate an electrically neutral plasma by a magnetic field formed due to the presence of the anode electrode 24 and the cathode electrode 27. Furthermore, the Hall effect plasma accelerating apparatus 10 laminates a charge on a surface of a substrate on which ions are deposited, causing a loss such as a charge shunt and notching to occur in a minute pattern that may lead to a formation of a non-uniform etching profile.

FIG. 2 is a cross-sectional view showing a coaxial plasma accelerating apparatus 40 used for a plasma sputtering system or a plasma etcher as another example of a conventional plasma accelerating apparatus. The coaxial plasma accelerating apparatus 40 is disclosed in an article by J. T. Scheuer, et. al., IEEE Tran. on Plasma Sci., VOL. 22, No. 6, 1015, 1994.

Referring to FIG. 2, the coaxial plasma accelerating apparatus 40 includes a circular channel 50 having an upper shield end and a lower open end. The circular channel 50 accelerates plasma produced by discharging an internally introduced gas. A cylindrical cathode electrode 54 is positioned inside the channel 50. A cylindrical anode electrode 52 is positioned at an outer side of an opening of the channel 50, which is coaxially spaced apart from the cylindrical cathode electrode 54 by a predetermined distance. In addition, the coaxial plasma accelerating apparatus 40 includes a control coil 64, a cathode coil 56, and an anode coil 58. The control coil 64 controls plasma in the channel 50. The cathode coil 56 is provided inside the cathode electrode 54. The anode coil 58 is provided outside the anode electrode 52.

The coaxial plasma accelerating apparatus 40 generates an electric current flowing through the channel 50 therein and induces a radial magnetic field enclosing the cathode electrode 54 by the generated current by including a channel 50 and a control coil 64. Here, the channel 50 has inner and outer walls in which the anode electrode 52 and the cathode electrode 54 are provided, respectively, and the control coil 64 is provided at an outside of the channel 50. In the coaxial plasma accelerating apparatus 40, a speed of a plasma ion at an outlet port is very high, for example, of about 500 eV, and a direct current discharge by an anode electrode and a cathode electrode is used, and thus plasma ions accelerated from the anode electrode 52 to the cathode electrode 54 collide with the cathode electrode 54 in the channel 50. The cathode electrode 54 is significantly damaged through the collisions to become difficult to be used for an., etching process of a semiconductor thin film deposition process.

In order to address these and other problems, an inductively coupled discharge type plasma accelerating apparatus 60 has been suggested as shown in FIG. 3. With reference to FIG. 3, the inductively coupled discharge type plasma accelerating apparatus 60 includes a plasma channel 77, an upper circle loop inductor 79, an internal circle loop inductor 71, and an external circle loop inductor 73.

A gas is ionized and accelerated in the plasma channel 77. The plasma channel 77 has a doughnut shape, which includes an outlet port 77a. The outlet port 77a is open downwards (top part of FIG. 3). The outlet port 77a communicates with a process chamber 70 (see FIG. 5) of a plasma etcher or a sputtering system with the plasma accelerating apparatus 60. The upper circle loop inductor 79 is disposed at an end wall 81 of the plasma channel 77. The upper circle loop inductor 79 applies RF energy to the gas in the plasma channel 77 to generate electrons. The generated electrons collide with neutral atoms of the gas to form a plasma beam. Internal and external circle loop inductors 71 and 73 in which coils are wound are disposed at an inner wall 82 and an outer wall 83 of the plasma channel 77, respectively. The internal and external circle loop inductors 71 and 73 are coaxially arranged in a line.

The operation of the conventional plasma accelerating apparatus 60 will now be described with reference to FIG. 4. When a gas is supplied to an inside of the plasma channel 77 from a gas source (not shown), the upper circle loop inductor 79 applies RF energy to the supplied gas to generate electrons. Consequently, the electrons collide with neutral atoms of the gas, and the gas is ionized to produce a plasma beam.

The internal and external circle loop inductors 71 and 73 induce a magnetic field B and a secondary electric current J in the plasma channel 77 to form an electromagnetic force F, which accelerates the plasma beam toward an outlet port 77a of the plasma channel 77.

Since such a plasma accelerating apparatus 60 accelerates ions in the same direction regardless of a polarity of the electromagnetic force F, an anode electrode and a cathode electrode that conventional electrostatic type accelerating apparatuses 10 and 40 require become unnecessary. This leads to a simple construction thereof. Furthermore, the plasma accelerating apparatus 60 adjusts an electric current through the internal and external circle loop inductors 71 and 73. By using the inductors, the generated electromagnetic force F may be more easily adjusted.

However, since the plasma accelerating apparatus 60 includes a plasma channel of a cylindrical shape, the plasma beam accelerated toward an outlet port 77a of the plasma channel 77, as shown by the dashed line of FIG. 5, is not uniformly guided toward a center of a process chamber 70. Accordingly, the plasma beam is not uniformly supplied to a substrate 85 or a sputter target (not shown) fixed to a substrate holder 80 under a center of the plasma channel. Therefore, either an etching profile of the substrate 85 to be etched inside the process chamber becomes non-uniform, or a uniformity of a thin film deposited on a substrate by materials sputtered from a sputter target is deteriorated.

SUMMARY OF THE INVENTION

Accordingly, it is an aspect of the present invention to provide a plasma accelerating apparatus and a plasma processing system having the same, which uniformly supplies a plasma beam into a process chamber during processing of a semiconductor substrate such as etching or sputtering.

The above and other aspects of the present invention are realized by providing a plasma accelerating apparatus including a circular channel comprising an inner wall, an outer wall spaced apart from the inner wall by a distance for encircling the inner wall, and an end wall connected to an end of the inner wall and an end of the outer wall to form an outlet port at the other ends of the inner and outer walls; a gas supply portion which is configured to supply a gas to an inside of the channel; and a plasma generating and accelerating portion which is configured to supply ionization energy to the gas inside the channel to generate a plasma beam, and to accelerate the generated plasma beam toward the outlet port, wherein at least one of the inner wall and outer wall of the channel is inclined at an angle so that the other end of the at least one of the inner wall and outer wall is located closer to a center of the plasma accelerating apparatus.

The inner wall of the channel may be inclined at the angle, or both the inner wall and the outer wall may be included at the angle.

The plasma generating and accelerating portion may include an upper inductor disposed at an outer periphery in an axial direction of the end wall; an inner inductor disposed at a radial inside of the inner wall to reduce an induction magnetic field in an axial direction in the channel; and an external inductor disposed at a radial outside of the outer wall parallel with the internal inductor to reduce an induction magnetic field in an axial direction in the channel.

Each of the internal and external inductors may comprise a plurality of loop coils, each of the plurality of loop coils having a same number of turns, and wherein an electric current supplied to each successive loop coil of the plurality of loop coils is sequentially reduced in an axial direction from the end wall towards the output port.

Each of the internal and external inductors may comprise a plurality of loop coils, each successive loop coil, in an axial direction, of the plurality of loop coils having a number of turns that is sequentially reduced.

In accordance with another aspect of the present invention, there is provided a plasma processing system comprising a channel comprising an inner wall, an outer wall spaced apart from the inner wall by a distance for encircling the inner wall, and an end wall connected to an end of the inner wall and an end of the outer wall to form an outlet port at the other ends of the inner and outer walls; a first gas supply portion which is configured to supply a gas to an inside of the channel; a plasma generating and accelerating portion which is configured to supply ionization energy to the gas inside the channel to generate a plasma,, beam, and to accelerate the generated plasma beam toward the outlet port; and a process chamber communicating with the outlet port of the channel and including a substrate holder for fixing a substrate, wherein at least one of the inner and outer walls of the channel is inclined at an angle so that the other end of the at least one of the inner wall and outer wall is located closer to a center of the plasma accelerating apparatus.

The inner wall of the channel may be inclined at the angle. Both the inner wall and the outer wall may be inclined at the angle The plasma generating and accelerating portion may include an upper inductor disposed at an outer periphery in an axial direction of the end wall of the channel; an inner inductor located at a radial inside of the inner wall to reduce an induction magnetic field in an axial direction in the channel; and an external inductor located at a radial outside of the outer wall parallel with the internal inductor to reduce an induction magnetic field in an axial direction in the channel.

Each of the internal and external inductors may include a plurality of loop coils, each of the plurality of loop coils having a same number of turns, and wherein an electric current supplied to each successive loop coil of the plurality of loop coils is sequentially reduced in an axial direction from the end wall towards the output port.

Each of the internal and external inductors may comprise a plurality of loop coils, each successive loop coil, in an axial direction, of the plurality of loop coils having a number of turns that is sequentially reduced.

The system may further comprise a second gas supply portion which is configured to supply a process gas into the process chamber.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS OF THE PRESENT INVENTION

Hereinafter, a plasma accelerating apparatus and a plasma processing system including the plasma accelerating apparatus according to an exemplary embodiment of the present invention will be described with reference to accompanying drawings in detail.

Figure 6:
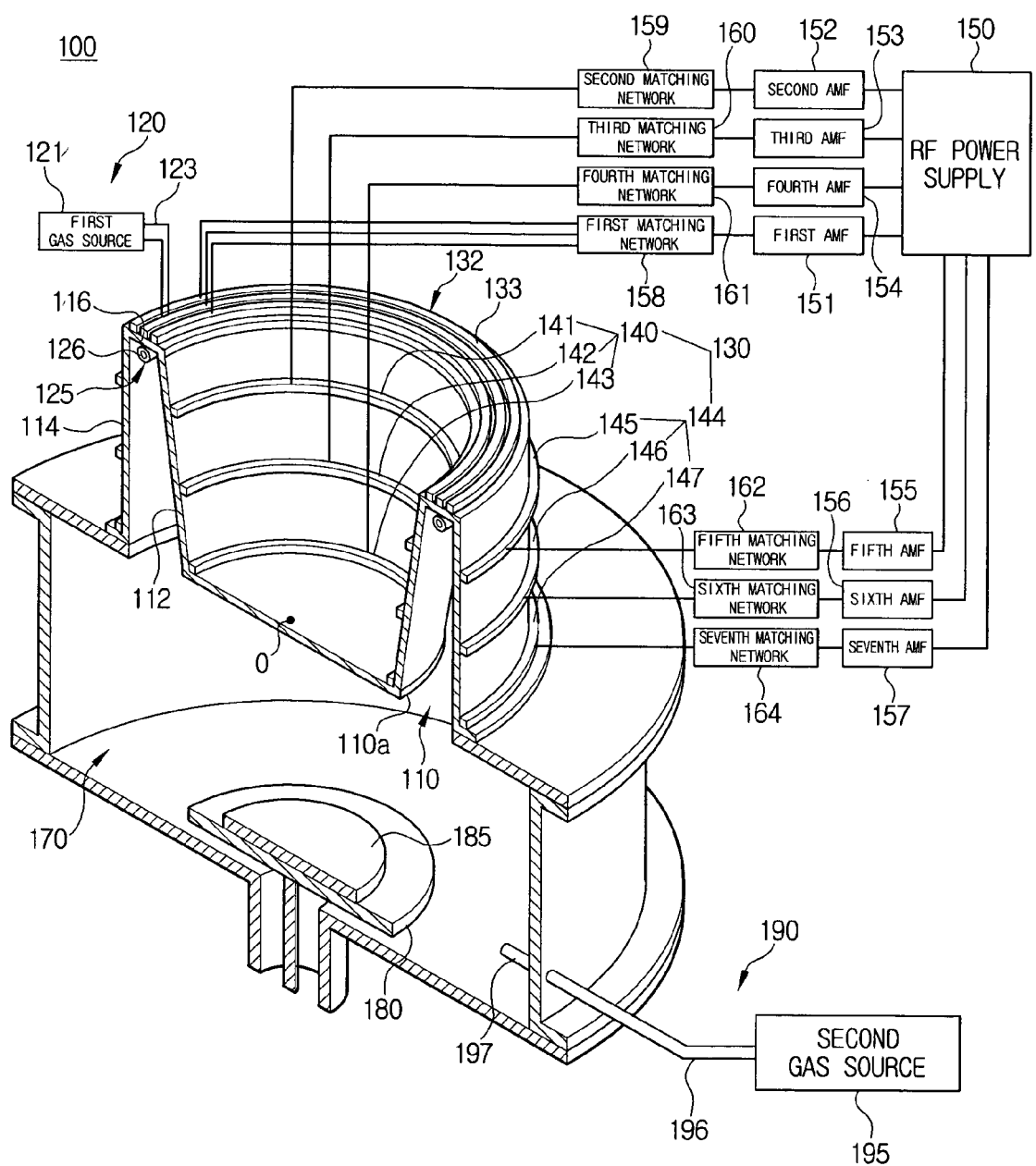
FIG. 6 is a schematic cut-away perspective view showing a plasma processing system including a plasma accelerating apparatus according to an exemplary embodiment of the present invention.

FIG. 6 is a schematic cut-away perspective view showing a plasma processing system 100 including a plasma accelerating apparatus according to an exemplary embodiment of the present invention.

The plasma processing system 100 of the present invention is a plasma etcher that forms a selective etching pattern on a substrate 185 by evaporating or ashing, a thin film such as photoresist coated on the substrate using high temperature ionized plasma to remove it therefrom.

With reference to FIG. 6, the plasma processing system 100 includes a plasma channel 110, a first gas supply portion 120, a plasma generating and accelerating portion 130, a process chamber 170, and a second gas supply portion 190. The plasma channel 110, the first gas supply portion 120, and the plasma generating and accelerating portion 130 constitute the plasma accelerating apparatus according to an exemplary embodiment of the present invention.

A gas is ionized and accelerated in the plasma channel 110. The plasma channel 110 has a doughnut shape, which includes an outlet port 110a. The outlet port 110a is open in a discharge direction. The plasma channel 110 includes an inner wall 112, an outer wall 114, and an end wall 116 for connecting the inner wall 112 and the outer wall 114 to each other.

Figure 7:
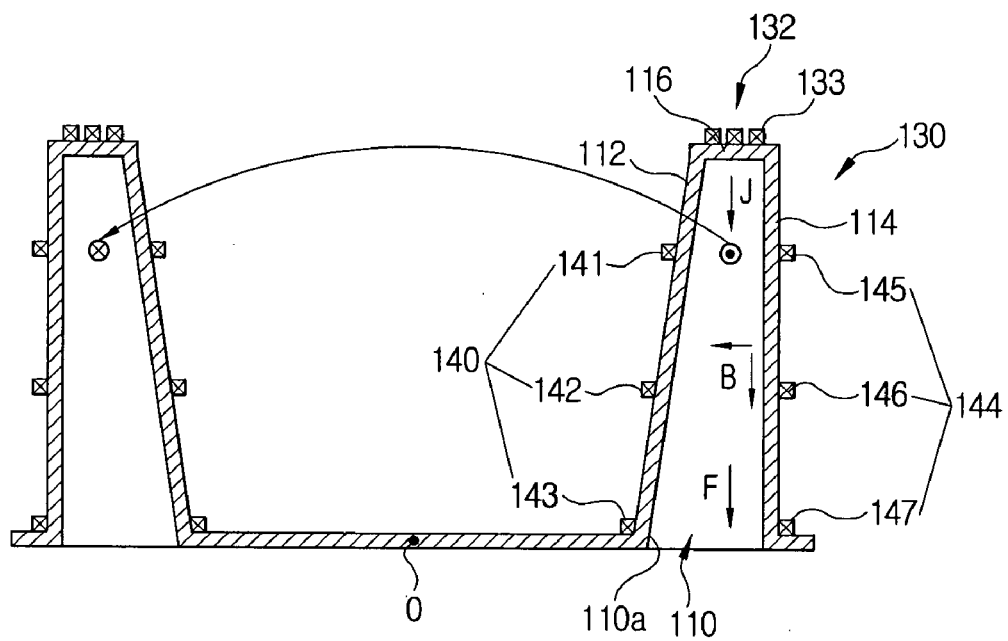
FIG. 7 is a cross-sectional view showing a plasma channel of the plasma processing system shown in FIG. 6.

As shown in FIGS. 6 and 7, the inner wall 112 of the channel 110 has a truncated-cone shape and is inclined at an angle, such that the outlet port end of the inner wall 112 is closer to a center O of a circle defined by the plasma channel 110. The angle may be predetermined.

The outer wall 114 has a cylindrical shape with a diameter greater than that of an upper portion of the inner wall 112 by a distance for defining a space between the inner wall 112 and the outer wall 114. The distance and space may be predetermined.

The reason why the inner wall 112 is slanted at an angle is to introduce a plasma beam, which is formed by the plasma generating and accelerating portion 130 and accelerated toward the outlet port 110a, toward a center of the process chamber 170 by a slanted inner wall 112. Accordingly, unlike the plasma channel 77 of the conventional plasma accelerating apparatus 60 described by reference to FIG. 3, the plasma beam accelerated toward the outlet port 110a of the plasma channel 110 by the plasma generating and accelerating portion 130 (as shown by a dotted line in FIG. 10) may be uniformly distributed toward the center of the process chamber 110. As a result, a substrate 185 disposed under the center O of the plasma channel 110 in the process chamber 100 is uniformly exposed to the plasma beam, thereby uniformly forming an etch profile of photoresist and the like coated on the substrate 185.

Figure 8:
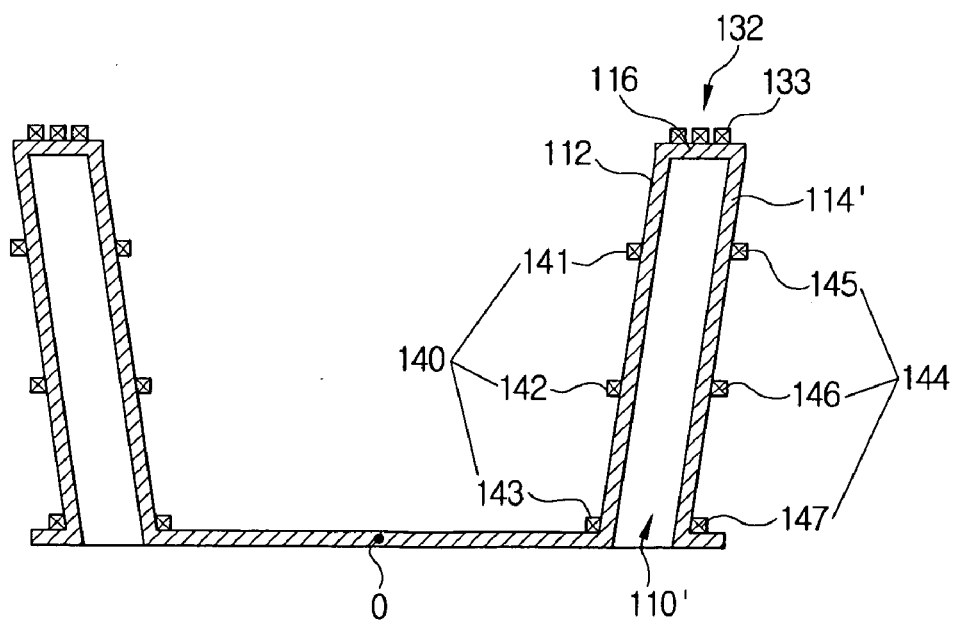
FIG. 8 is a partially cross-sectional view showing a modified example of the plasma channel of the plasma processing system shown in FIG. 6.

Alternatively, as shown in FIG. 8, the inner and outer walls 112 and 114' of the plasma channel 110 may both be inclined at an angle so that outlet port 110a ends of both the inner and outer walls 112 and 114' become closer to the center O. In this case, as in the construction of FIG. 7 in which only the inner wall 112 is inclined, the plasma beam accelerated toward an outlet port 110a of the plasma channel 110' by the plasma generating and accelerating portion 130 may be uniformly distributed toward a center of the process chamber 170.

Referring again to FIG. 6, the inner wall 112, the outer wall 114, and the end wall 116 of the plasma channel 110 are made of a non-conductive material such as quartz or Pyrex, or other similar non-conductive material known in the art. An outlet port 110a of the plasma channel 110 communicates with a process chamber 170.

The first gas supply portion 120 includes a first gas injection portion 125 and a first gas source 121. The first gas injection portion 125 is fixed and installed at an inner side of an end wall 116 of the plasma channel 110. The first gas injection portion 125 includes a gas injection ring 126 connected to the first gas source 121 through the first connection pipe 123. The gas injection ring 126 includes a plurality of discharge holes formed in the outlet port 110a side. Each diameter of the discharge holes is smaller than that of the gas injection ring 126. The first gas source 121 stores ionization gases of group 0 such as Ar and reaction gases such as O2 or O2 compound, and process gases such as $C_2F_2$.

The plasma generating and accelerating portion 130 is arranged at outer peripheral parts of an inner wall 112, and an outer wall 114, and an end wall 116 of the plasma channel 110. The plasma generating and accelerating portion 130 includes an upper circle loop inductor 132, and internal and external circle loop inductors 140 and 144.

The upper circle loop inductor 132 is provided with an upper circle loop coil 133. The upper circle loop coil 133 is wound around an outside of the end wall 116 of the plasma channel 110 by a plurality of turns. An RF power supply 150 applies RF energy of approximately 500 W to approximately 5.0 kW to the upper circle loop coil 133 through a first amplifier 151 and a first matching network 158 coupled thereto to operate the upper circle loop coil 133 at a frequency of approximately 2 MHz. It is advantageous for the RF power supply 150 to apply energy of approximately 2.0 kW. In other words, the upper circle loop coil 133 applies RF energy in the gas fed through discharge holes of the gas injection ring 126, causing electrons generated by the RF energy to collide with neutral atoms of the gas. Accordingly, the gas is ionized to generate a plasma beam.

In addition, an electric current of about 40A is supplied to the upper circle loop coil 133 through the first amplifier 151 and the first matching network 158 coupled to an RF power supply 150. Consequently, as in the description of a procedure for inducing an electromagnetic force F by the internal and external circle loop inductors 140 and 145 with reference to FIG. 7, the upper circle loop coil 133 induces a magnetic field B and a secondary electric current J in the plasma channel 110 to generate electromagnetic force F, which accelerates the plasma beam toward the outlet port 110a of the plasma channel 110.

The internal and external circle loop inductors 140 and 144 are disposed at an inside (radial inside of FIG. 6) of the inner wall 112 of the plasma channel 110, and an outside (radial outside of FIG. 6) of the outer wall 114 thereof, respectively. The internal and external circle loop inductors 140 and 144 include first, second, and third internal circle loop coils 141, 142, and 143, and first, second, and third external circle loop coils 145, 146, and 146, respectively which are wound by one turn. The first, second, and third internal circle loop coils 141, 142, and 143, and the first, second, and third external circle loop coils 145, 146, and 147 are coaxially arranged in a line.

An RF power supply 150 applies RF energy of about 500 W to about 5.0 kW to the first, second, and third internal circle loop coils 141, 142, and 143 through second to fourth amplifiers 152, 153 and 154, and second to fourth matching networks 159, 160, and 161 connected thereto to operate the first, second, and third internal circle loop coils 141, 142, and 143, respectively, at a frequency of approximately 2 MHz. Moreover, the RF power supply 150 applies RF energy of about 500 W to about 5.0 kW to the first, second, and third external circle loop coils 145, 146, and 147 through fifth to seventh amplifiers 155, 156 and 157, and fifth to seventh matching networks 162, 163, and 164 connected thereto to operate the first, second, and third external circle loop coils 145, 146, and 147, respectively, at a frequency of about 2 MHz. It is advantageous that the circle loop coils 141, 142, 143, 145, 146, and 147 operate by RF energy of approximately 2.0 kW.

The first, second, and third internal circle loop coils 141, 142, and 143, and the first, second, and third external circle loop coils 145, 146, and 147 operate with RF energy of about 500 W to about 5.0 kW at about 2 MHz as in the upper circle loop inductor 132. However, since the first, second, and third internal circle loop coils 141, 142, and 143, and the first, second, and third external circle loop coils 145, 146, and 147 are wound by one turn, and are separated by a certain distance apart from each other, although RF energy is applied to a gas, the plasma beam is hardly formed. The certain distance may be predetermined.

Figure 9:
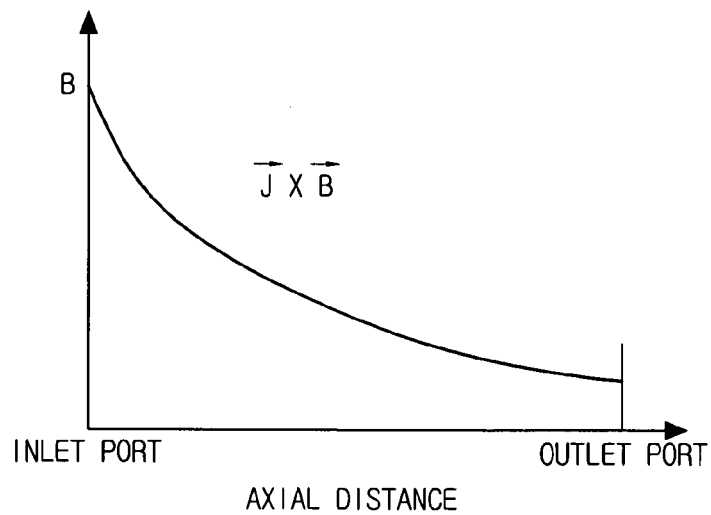
FIG. 9 is a graph showing an intensity of a magnetic field according to an axial length of the plasma channel of the plasma processing system shown in FIG. 6.

An electric current supplied from the RF power supply 150 to the first, second, and third internal circle loop coils 141, 142, 143, and the first, second, and third external circle loop coils 145, 146, and 147 through second to seventh amplifiers 152, 153, 154, 155, 156, and 157, and second to seventh matching networks 159, 160, 161, 162, 163, and 164 is gradually reduced in an axial direction in the plasma channel 110. The reason is that a magnetic field drifts from a higher magnetic field pressure to a lower magnetic filed pressure. That is, since the electric current supplied from the RF power supply 150 to the first, second, and third internal circle loop coils 141, 142, 143, and the first, second, and third external circle loop coils 145, 146, and 147 is sequentially reduced in the axial direction, as shown in FIG. 9, a magnetic field induced inside the plasma channel 110 decreases in the axial direction, namely, toward an outlet port 110a. As a result, a pressure difference of the magnetic field occurs among the first, second, and third internal circle loop coils 141, 142, and 143, and among the first, second, and third external circle loop coils 145, 146, and 147. This pressure difference causes the plasma beam to be further rapidly accelerated toward an outlet port 110a of the plasma channel 110.

For example, the RF power supply 150 applies electric currents of 60A, 40A, and 20A to the first, second, and third internal circle loop coils 141, 142, and 143 through the second to fourth amplifiers 152, 153, and 154, and the second to fourth matching networks 159, 160, 161, respectively. The RF power supply 150, applies electric currents of −25 A, −15 A, and −5 A to the first, second, and third external circle loop coils 145, 146, and 147 through the fifth to seventh amplifiers 155, 156, and 157, and the fifth to seventh matching networks 162, 163, 164, respectively.

Consequently, as shown in FIG. 7, the electric currents flowing through the first, second, and third internal circle loop coils 141, 142, and 143, and through the first, second, and third external circle loop coils 145, 146, and 147 induce a magnetic field B inside the plasma channel 110, and accordingly the induced magnetic field B also induces a secondary current J in accordance with Maxwell's equations.

The secondary current J and the magnetic field B produce an electromagnetic force F in a z axis direction, which accelerates a plasma beam toward an outlet port 110a of the plasma channel 110 regardless of a polarity according to equation 1:

$$F = J \times B \qquad (1)$$

In addition, the electric currents applied to the first, second, and third internal circle loop coils 141, 142, and 143, and the electric currents applied to the first, second, and third external circle loop coils 145, 146, and 147 are sequentially reduced, and accordingly the magnetic field induced inside the plasma channel 110 is reduced in an axial direction. As a result, due to characteristics of a magnetic field that is drifted from a higher magnetic filed pressure to a lower magnetic filed pressure, a plasma beam accelerated by the electromagnetic force F is further accelerated toward the outlet port 110a of the plasma channel 110.

As described above, an electromagnetic force F produced by the first and second electric currents flowing through the first, second, and third internal circle loop coils 141, 142, 143, and the first, second, and third external circle loop coils 145, 146, and 147, and the pressure difference of the magnetic field among the first, second, and third internal circle loop coils 141, 142, and 143, and among the first, second, and third external circle loop coils 145, 146, and 147 accelerate the plasma beam. Thus, electrons and positive ions in a plasma beam mix with each other to produce neutral particles having a plasma density of about $10^{11}$ to about $10^{12}$ electrons/cm$^3$ and ion energy of about 20 to about 500 eV, for example.

Here, although exemplary embodiment of the present invention has been illustrated that an electric current supplied to the circle loop coils 141, 142, 143, and the first, second, and third external circle loop coils 145, 146, and 147 is sequentially reduced in order to reduce the magnetic field inside the plasma channel 110 in an axial direction, the magnetic field induced inside the plasma channel 110 may be reduced in the axial direction by reducing the number of turns of the coils wound in an axial direction and applying the same current to the first, second, and third internal circle loop coils 141, 142, 143, and the first, second, and third external circle loop coils 145, 146, and 147.

Further, although the embodiment of the present has been illustrated that the first, second, and third internal circle loop coils 141, 142, 143, and the first, second, and third external circle loop coils 145, 146, and 147 function to accelerate a plasma beam, they can function to generate the plasma beam by increasing the number of turns of the circle loop coils.

The process chamber 170 communicates with an outlet port 110$a$ of the plasma channel 110. A plasma beam drifted due to the electromagnetic force F and the pressure difference of a magnetic field generated by the magnetic field generating and accelerating portion 130 is supplied to the process chamber 170. The process chamber 170 is maintained at a pressure of about 0.3 to about 3 mTorr.

A substrate holder 180 is disposed at an internal center of the process chamber 170. A substrate 185 on which thin film such as photoresist or other thin film known in the art to be etched is coated is fixed to the substrate holder 180. The substrate holder 180 is made of a copper block heated or cooled by a heating and cooling circuit (not shown). A second gas injection port 197 of the second gas supply portion 190 is disposed at one side of the process chamber 170, and supplies a process gas into the process chamber 170. The second injection port 197 is connected to a second gas source 195 through a connection pipe 196. The second gas source 195 stores a process gas such as $C_2F_2$ or other process gas known in the art.

Figure 11:
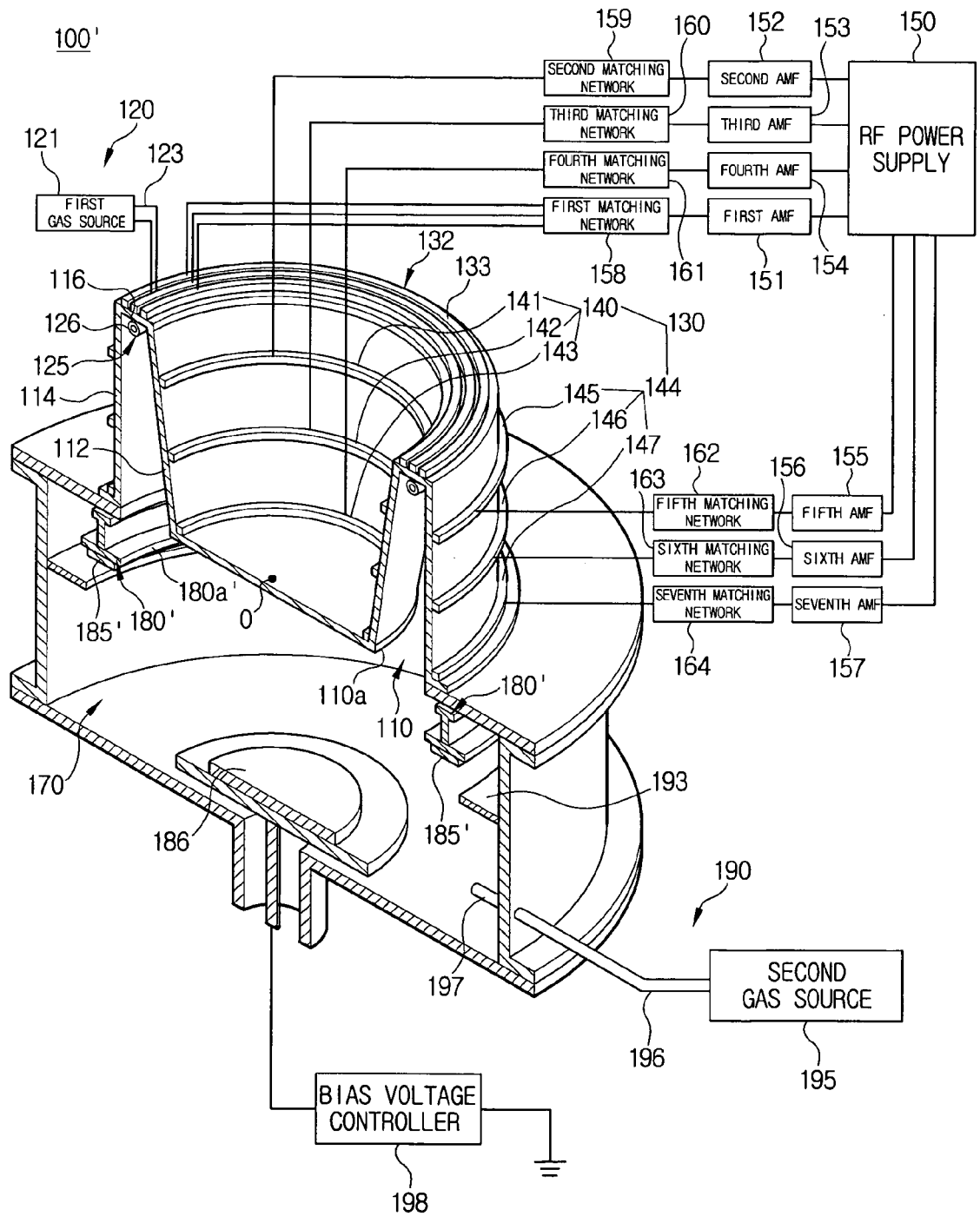
FIG. 11 is a schematic perspective view showing a plasma sputtering system including a plasma accelerating apparatus according to an exemplary embodiment of the present invention.

Although the plasma processing system with a plasma accelerating apparatus according to an exemplary embodiment of the present invention has been described as a plasma etcher, which forms a selective etching pattern on a substrate 185 using high temperature plasma, the present invention is not limited thereto. For example, the plasma processing system of the present invention can be configured as a plasma sputtering system 100 shown in FIG. 11, which deposits a thin film on a substrate using the same construction and operation as those of the plasma processing system described above. In this case, as shown in FIG. 11, the plasma sputtering system 100' further includes a sputter target 186. A bias voltage generated by a bias voltage controller 198 is applied to the sputter target 186. The bias voltage may be predetermined. A substrate 185' is fixed to a substrate holder 180' above the sputter target 186. The substrate holder 180' is rotated based on a fixed axis (not shown) to uniformly deposit materials sputtered from the sputter target 186 on the substrate 185'. Also, the substrate holder 180' includes a circular opening 180$a'$ through which the plasma beam accelerated in the plasma generating and accelerating portion 130 passes so that the plasma is guided to the sputter target 186. A horizontal baffle 193 is disposed at an upper portion of the second gas injection port 197 and controls gas pressure in the vicinity of the substrate 180'.

Figure 1:
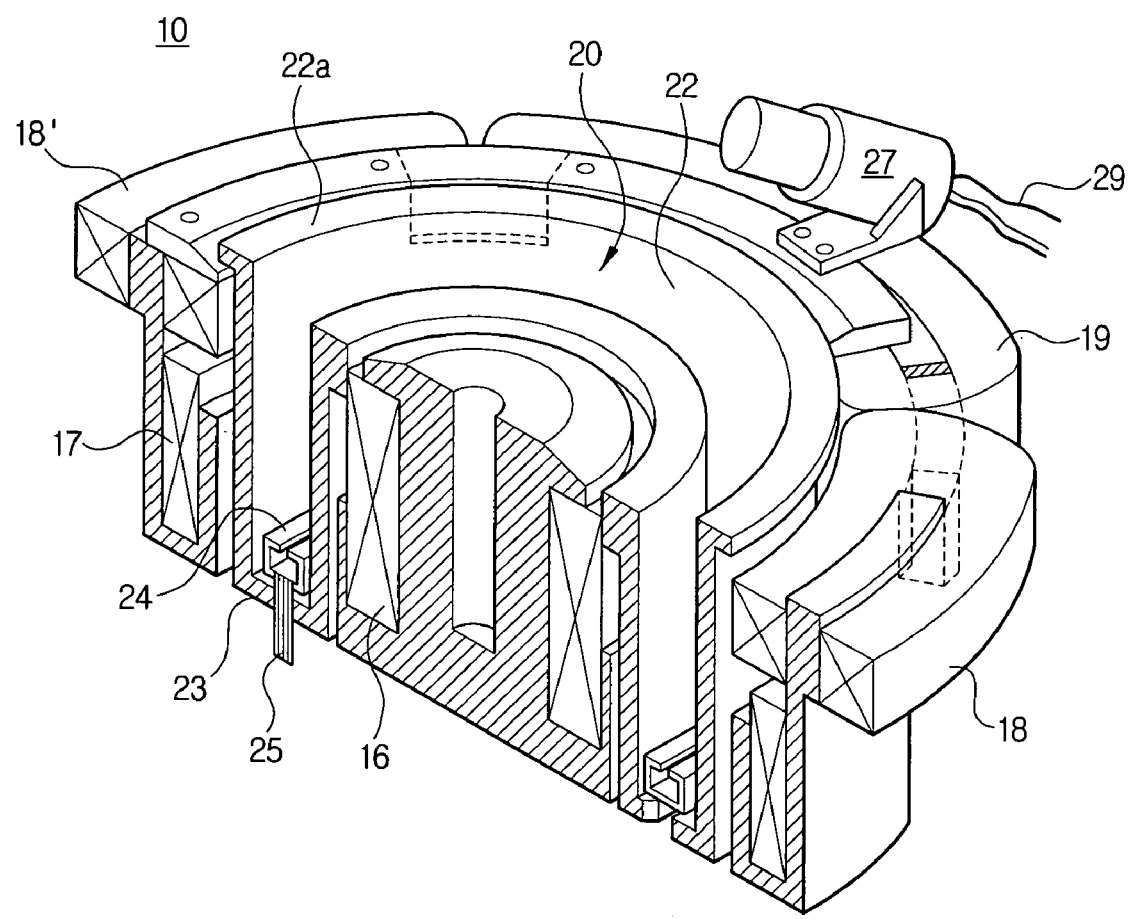
FIG. 1 is a schematic cut-away perspective view showing an example of a conventional plasma accelerating apparatus.
Figure 2:
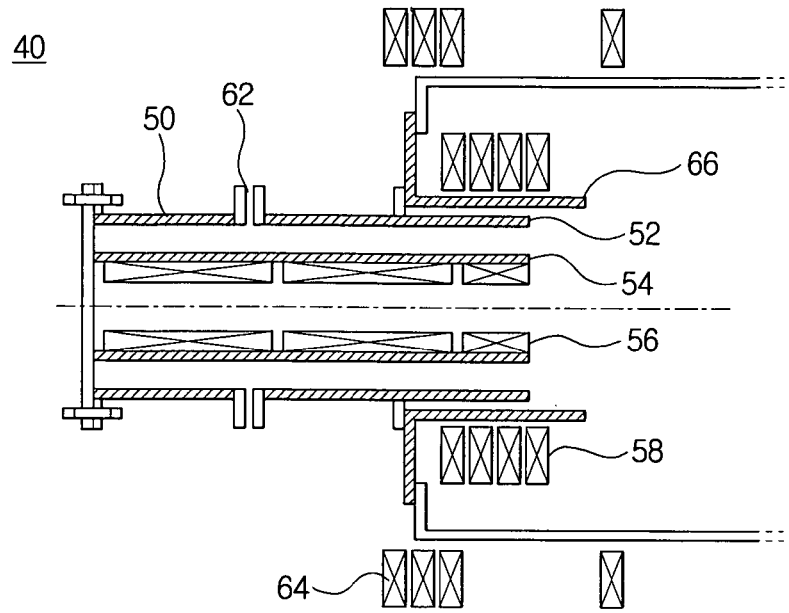
FIG. 2 is a cross-sectional view showing another example of a conventional plasma accelerating apparatus.
Figure 3:
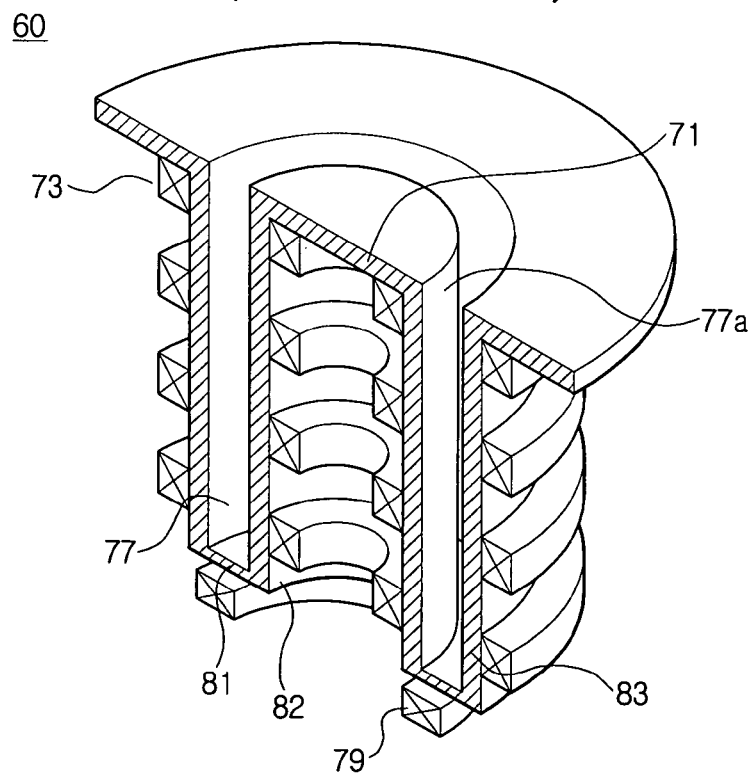
FIG. 3 is a schematic cut-away perspective view showing a further example of a conventional plasma accelerating apparatus.
Figure 4:
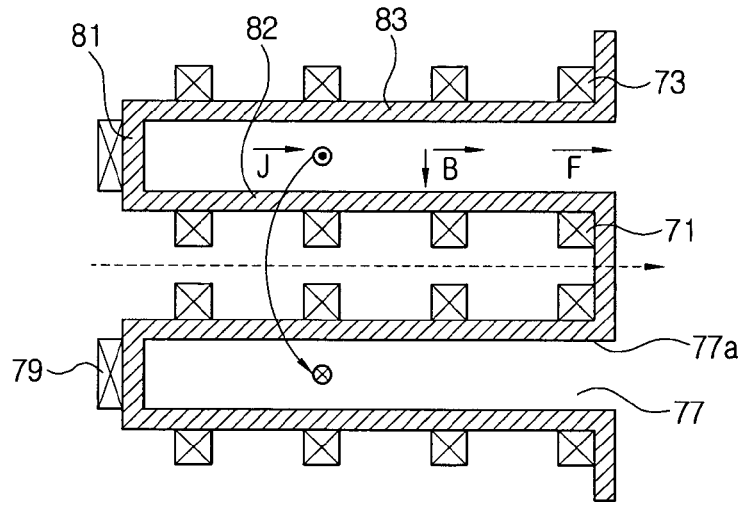
FIG. 4 is a cross-sectional view of the plasma accelerating apparatus shown in FIG. 3.
Figure 5:
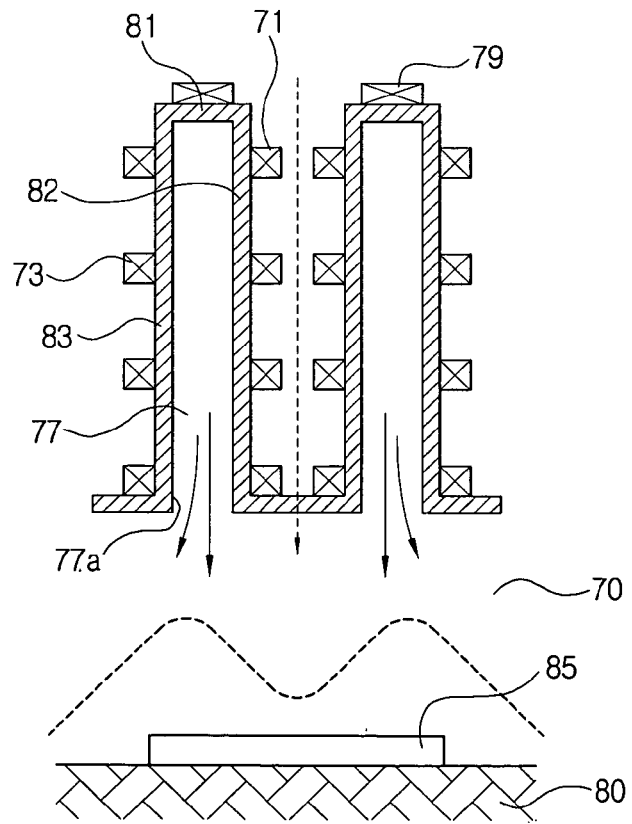
FIG. 5 is a graph showing a distribution of a plasma beam that is discharged into a process chamber using a plasma accelerating apparatus shown in FIG. 3.

In addition, although an exemplary embodiment of the present invention has been described such that an arrangement of the plasma channel 110 of the plasma generating and accelerating portion 130 in the plasma processing system 100 is used for the conventional plasma accelerating apparatus 60 as seen from FIG. 3, the arrangement of the plasma channel 110 may be applied to, for example, channels 22 and 50 of the plasma accelerating apparatuses 10 and 40 as illustrated from FIGS. 2 and 3 in the same construction and principle in order to uniformly distribute the plasma beam inside the process chamber.

Figure 10:
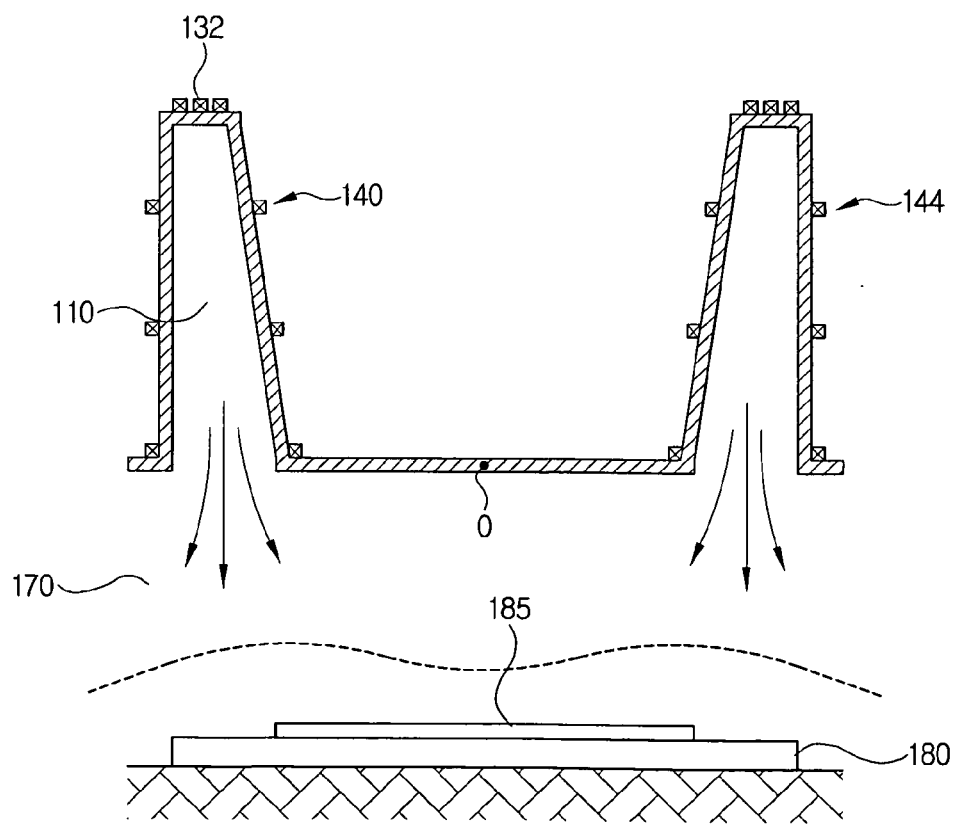
FIG. 10 is a graph showing a distribution of a plasma beam that is discharged into a process chamber in a plasma processing system shown in FIG. 6.

An operation of the plasma processing plasma system 100 having the aforementioned construction will be now explained by reference to FIGS. 6, 7, and 10. Firstly, a gas such as $C_2F_2$, $O_2$, or Ar, or other such gas known in the art, from the first gas source 121 is supplied into the plasma channel 110 through the first gas injection port 125. Neutral atoms of the gas supplied into the plasma channel 110 collide with electrons generated by an RF energy applied by an upper circle loop inductor 132, with the result that the gas is ionized to produce a plasma beam. At this time, the upper circle loop inductor 132 is operated in an RF energy of about 2.0 kW at a frequency of approximately 2 MHz.

Due to an electromagnetic force F generated by the internal and external circle loop inductors 140 and 144, and a pressure difference of a magnetic field among the first, second, and third internal circle loop coils 141, 142, and 143 of the internal circle loop inductor 140, and among the first, second, and third external circle loop coils 145, 146, and 147 of the external circle loop inductor 144, the plasma beam is accelerated toward an outlet port 110$a$ of the plasma channel 110, and ions are discharged to an inside of the process chamber 170 through the outlet port 110$a$ with plasma density of about $10^{11}$ to about $10^{12}$ electrons/cm$^3$ and ion energy of about 20 to about 500 eV.

Since the inner wall 112 of the plasma channel 110 is formed to be inclined toward a center O, the plasma beam discharged to the inside of the process chamber 170 through the outlet port 110$a$ can be uniformly moved toward the substrate 185 fixed to the substrate holder 180 of the process chamber 170. Consequently, during an etching process of the substrate 185, the substrate 185 disposed at the center O of the plasma channel 110 in the process chamber 170, is uniformly exposed to the plasma beam (as shown in FIG. 10). Further, the process gas from the second gas source 195 is supplied into the process chamber 170 through the second gas injection port 197 with a pressure of approximately 1 mTorr. Accordingly, the plasma beam collides with the process gas and becomes a directional or non-directional etching ion or atom. Consequently, a thin film such as photoresist of the substrate 185 disposed at the center O of the plasma channel 110 in the process chamber 170, is vaporized or carbonized to be etched with an etching rate of about 20 nm/min, and an etching profile of the substrate 185 is uniformly formed.

As apparent from the above description, in the plasma accelerating apparatus and the plasma processing system having the same according to exemplary embodiments of the present invention, since the inner and outer walls of the channel are inclined at an angle so that at least outlet port ends of the inner and outer walls become closer to the center, the plasma beam accelerated toward an outlet port by a plasma generating and accelerating portion may be uniform supplied from a lower portion of a center of the plasma channel to a substrate to be etched or a sputter target to be sputtered positioned at the process chamber. Therefore, an etching profile of the substrate becomes uniform, with the result that precision of an etching pattern in the substrate or the uniformity of a thin film deposited on the substrate with sputtered material may be enhanced.

The foregoing embodiments are merely exemplary and are not to be construed as limiting the present invention. The present teaching can be readily applied to other types of apparatuses. Also, the description of exemplary embodiments of the present invention is intended to be illustrative, and not to limit the scope of the claims, and many alternatives, modifications, and variations will be apparent to those skilled in the art.

What is claimed is:

1. A plasma accelerating apparatus comprising:
   a circular channel comprising an inner wall, an outer wall spaced apart from the inner wall by a distance for encircling the inner wall, and an end wall connected to an end of the inner wall and an end of the outer wall to form an outlet port at the other ends of the inner and outer walls;
   a gas supply portion which is configured to supply a gas to an inside of the channel; and
   a plasma generating and accelerating portion which is configured to supply ionization energy to the gas inside the channel to generate a plasma beam, and to accelerate the generated plasma beam toward the outlet port,
   wherein at least one of the inner wall and outer wall of the channel is inclined at an angle so that the other end of the at least one of the inner wall and outer wall is located closer to a center of the plasma accelerating apparatus, and
   wherein the plasma generating and accelerating portion comprises:
   an upper inductor disposed at an outer periphery in an axial direction of the end wall of the channel;
   an inner inductor disposed at a radial inside of the inner wall to reduce an induction magnetic field in an axial direction in the channel; and
   an external inductor disposed at a radial outside of the outer wall parallel with the internal inductor to reduce an induction magnetic field in an axial direction in the channel.

2. The apparatus as claimed in claim 1, wherein the inner wall of the channel is inclined at the angle.

3. The apparatus as claimed in claim 1, wherein both the inner wall and the outer wall are inclined at the angle.

4. The apparatus as claimed in claim 1, wherein each of the internal and external inductors comprises a plurality of loop coils, each of the plurality of loop coils having a same number of turns, and wherein an electric current supplied to each successive loop coil of the plurality of loop coils is sequentially reduced in an axial direction from the end wall towards the output port.

5. The apparatus as claimed in claim 1, wherein each of the internal and external inductors comprises a plurality of loop coils, each successive loop coil, in an axial direction, of the plurality of loop coils having a number of turns that is sequentially reduced.

6. A plasma processing system comprising:
   a channel comprising an inner wall, an outer wall spaced apart from the inner wall by a distance for encircling the inner wall, and an end wall connected to an end of the inner wall and an end of the outer wall to form an outlet port at the other ends of the inner and outer walls;
   a first gas supply portion which is configured to supply a gas to an inside of the channel;
   a plasma generating and accelerating portion which is configured to supply ionization energy to the gas inside the channel to generate a plasma beam, and to accelerate the generated plasma beam toward the outlet port; and
   a process chamber communicating with the outlet port of the channel and including a substrate holder for fixing a substrate,
   wherein at least one of the inner and outer walls of the channel is inclined at an angle so that the other end of the at least one of the inner wall and outer wall is located closer to a center of the plasma accelerating apparatus; and
   wherein the plasma generating and accelerating portion comprises:
   an upper inductor disposed at an outer periphery in an axial direction of the end wall of the channel;
   an inner inductor disposed at a radial inside of the inner wall of the channel to reduce an induction magnetic field in an axial direction in the channel; and
   an external inductor disposed at a radial outside of the outer wall of the channel parallel with the internal inductor to reduce an induction magnetic field in an axial direction in the channel.

7. The system as claimed in claim 6, wherein the inner wall of the channel is inclined at the angle.

8. The system as claimed in claim 6, wherein both the inner wall and outer wall are inclined at the angle.

9. The system as claimed in claim 6, wherein each of the internal and external inductors comprises a plurality of loop coils, each of the plurality of loop coils having a same number of turns, and an electric current supplied to each successive loop coil of the plurality of loop coils is sequentially reduced in an axial direction from the end wall towards the outlet port.

10. The system as claimed in claim 6, wherein each of the internal and external inductors comprises a plurality of loop coils, each successive loop coil of the plurality of loop coils having a number of turns that is reduced in an axial direction from the end wall towards the outlet port.

11. The system as claimed in claim 6, further comprising a second gas supply portion which is configured to supply a process gas into the process chamber.

* * * * *